US012757677B2

(12) United States Patent
Chang

(10) Patent No.: US 12,757,677 B2
(45) Date of Patent: Oct. 6, 2026

(54) FRAME CASSETTE WITH INTERNAL COVER CASES

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 732 days.

(21) Appl. No.: 18/171,288

(22) Filed: Feb. 17, 2023

(65) Prior Publication Data

US 2024/0087930 A1 Mar. 14, 2024

Related U.S. Application Data

(60) Provisional application No. 63/375,538, filed on Sep. 13, 2022.

(51) Int. Cl.
*H10P 72/10* (2026.01)
*H10P 72/00* (2026.01)

(52) U.S. Cl.
CPC ...... *H10P 72/1922* (2026.01); *H10P 72/1904* (2026.01); *H10P 72/1926* (2026.01); *H10P 72/0428* (2026.01)

(58) Field of Classification Search
CPC ......... H01L 21/67356; H01L 21/67393; H01L 21/67386; H01L 21/67092; H10P 72/1922; H10P 72/1902; H10P 72/1904; H10P 72/1926; H10P 72/0428
See application file for complete search history.

(56) References Cited

U.S. PATENT DOCUMENTS 6,119,865 A * 9/2000 Kawada .............. H10P 72/1912 206/454
6,218,727 B1 4/2001 Merkl et al.
6,837,374 B2 1/2005 Nigg et al.
11,148,864 B1 * 10/2021 Shih .................. H01L 21/67303
2007/0227941 A1 10/2007 Narita et al.
2009/0038987 A1 2/2009 Hyobu
2009/0152162 A1 * 6/2009 Tian .................... H10P 72/1902 206/710

(Continued)

FOREIGN PATENT DOCUMENTS

CN 205680667 U 11/2016
CN 210338639 U 4/2020

(Continued)

OTHER PUBLICATIONS

The First Office Action received in the counterpart Taiwan application 112126675, mailed on May 30, 2024.

*Primary Examiner* — Glenn F Myers
(74) *Attorney, Agent, or Firm* — Kilpatrick Townsend & Stockton LLP

(57) ABSTRACT

A frame cassette used for semiconductor processing is provided. The frame cassette includes: a housing; and a plurality of cover cases disposed in the housing. Each of the plurality of cover cases is capable of accommodating a frame and includes: a bottom section; a top section parallel to the bottom section; and at least one sidewall extending, in a vertical direction, between and connecting the bottom section and the top section to form an enclosed space.

20 Claims, 8 Drawing Sheets

(56) References Cited

U.S. PATENT DOCUMENTS

| | | | | |
|---|---|---|---|---|
| 2010/0294397 | A1* | 11/2010 | Kishkovich | G03F 1/66 141/66 |
| 2011/0100937 | A1 | 5/2011 | Mohamed | |
| 2015/0206780 | A1* | 7/2015 | Choi | H10P 72/0402 29/428 |
| 2018/0308721 | A1 | 10/2018 | Schneider et al. | |
| 2019/0131147 | A1* | 5/2019 | Lee | H01L 21/67383 |
| 2022/0135326 | A1* | 5/2022 | Sakamoto | B65G 1/10 414/282 |
| 2023/0065892 | A1* | 3/2023 | Chiu | G03F 1/66 |

FOREIGN PATENT DOCUMENTS

| | | | |
|---|---|---|---|
| TW | 200810003 | A | 2/2008 |
| TW | 2017404700 | A | 11/2017 |
| TW | 202234529 | A | 9/2022 |
| WO | 2005044694 | A1 | 5/2005 |
| WO | 2018029881 | A1 | 2/2018 |

* cited by examiner

FRAME CASSETTE WITH INTERNAL COVER CASES

FIELD

Embodiments of the present disclosure relate generally to semiconductor packaging, and more particularly to frame cassettes with internal cover cases used for semiconductor packaging.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

While some integrated device manufacturers (IDMs) design and manufacture integrated circuits (IC) themselves, fabless semiconductor companies outsource semiconductor fabrication to semiconductor fabrication plants or foundries. Semiconductor fabrication consists of a series of processes in which a device structure is manufactured by applying a series of layers onto a substrate. This involves the deposition and removal of various dielectric, semiconductor, and metal layers. The areas of the layer that are to be deposited or removed are controlled through photolithography. Each deposition and removal process is generally followed by cleaning as well as inspection steps. Therefore, both IDMs and foundries rely on numerous semiconductor equipment and semiconductor fabrication materials, often provided by vendors. There is always a need for customizing or improving those semiconductor equipment and semiconductor fabrication materials, which results in more flexibility, reliability, and cost-effectiveness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
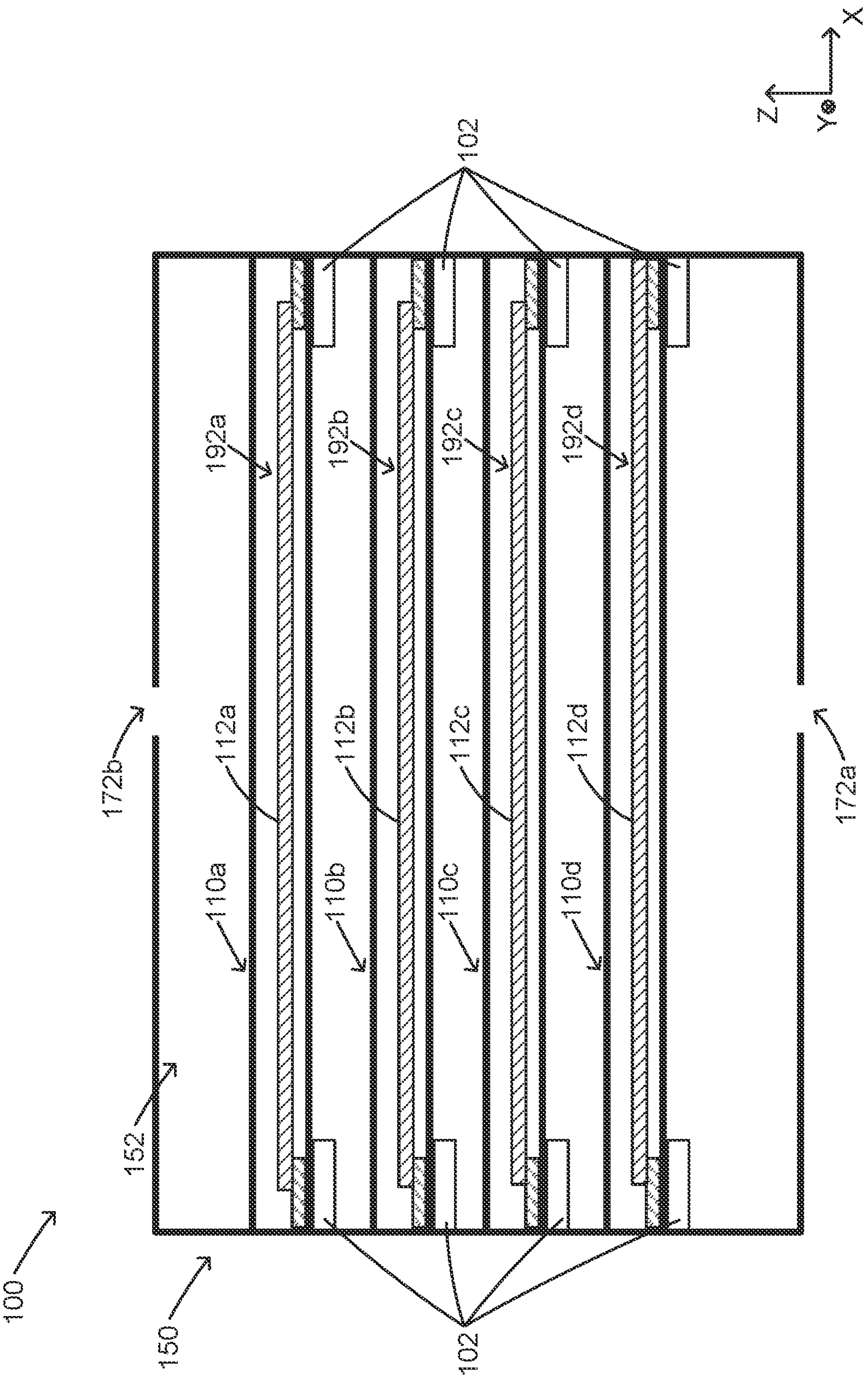
FIG. 1 is a diagram illustrating an example frame cassette in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Packaging technologies were once considered just back-end processes. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology often used in conjunction with hybrid bonding. CoWoS is a packaging technology that incorporates multiple chips side-by-side on a silicon interposer in order to achieve better interconnect density and performance. Individual chips are bonded through, for example, micro-bumps on a silicon interposer, forming a chip-on-wafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology.

Integrated Fan-Out (InFO) is another wafer-level packaging technology. InFO is a packaging technology that incorporates high-density redistribution layers (RDLs) and through InFO via (TIVs) for high-density interconnect and performance for various applications, such as mobile devices, high performance computing, etc. A wafer is typically diced into individual known good dies (KGDs) after testing, and the KGDs are placed on a temporary carrier with a certain distance apart. RDLs are formed subsequently to enable higher number of external contacts without increasing the size of KGDs.

On the other hand, those multiple chips that are bonded to the interposer in a CoWoS structure or embedded in an InFO structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding.

Stacking dies featuring ultra-high-density-vertical stacking (often using hybrid bonding) is sometimes referred to as System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

The dielectric-to-dielectric interface in either hybrid bonding or fusion bonding requires water ($H_2O$) as the bonding medium. Because of the presence of water as the bonding medium, silanol groups (i.e., Si—OH) exist at the surface of the silicon-containing dielectric (e.g., silicon dioxide, silicon oxynitride, etc.) layers at the dielectric-to-dielectric interface. In a polymerization process, the silanol groups (i.e., Si—OH) at both sides of the dielectric-to-dielectric interface polymerize to siloxane groups (i.e., Si—O—Si) and water (i.e., $H_2O$) in accordance with $Si—OH+Si—OH \rightarrow Si—O—Si+H_2O$. As such, the top die and the bottom die are bonded together. In addition to serving as the bonding medium, water is also used to wash the wafters or chips (or dies) to be bonded to eliminate unwanted particles at the bonding surfaces.

Top dies are typically disposed on a frame before the bonding process using a pick-and-place tool. Multiple frames are accommodated in a frame container (e.g., a frame cassette) during the transportation thereof. Conventionally, multiple frames are placed in a frame cassette, one above another in the vertical direction. Particles originated from one frame may drop on the top surface of dies disposed on another frame below the frame. Particles originated from the frame cassette may also drop on the top surface of dies. In addition, volatile organic compounds (VOCs), originated from frames or the frame cassette itself, exist in the space inside the frame cassette. Moreover, particles may also be introduced by the airflow inside the frame cassette. Particles, volatile organic compounds, and airflow particles all contribute to the contamination of the top surfaces of the dies, resulting in bonding interfaces with voids, delamination, non-bonding, and the like.

In accordance with some aspects of the disclosure, a frame cassette used for semiconductor processing is provided. The frame cassette includes a housing and multiple cover cases disposed in the housing. Each of the cover cases is capable of accommodating a frame. In one embodiment, each cover case includes a bottom section, a top section parallel to the bottom section, and at least one sidewall extending, in a vertical direction, between and connecting the bottom section and the top section to form an enclosed space.

The cover cases prevent corresponding frames from being contaminated by, for example, the particles originated from other frames, the particles originated from the frame cassette, the particles originated from the airflow, and volatile organic compounds. Details of various aspects of the disclosure will be described below in detail with reference to FIGS. 1-15.

Example Frame Cassette with Internal Cover Cases

FIG. 1 is a diagram illustrating an example frame cassette 100 in accordance with some embodiments. The frame cassette 100 is used for semiconductor processing. In the example shown in FIG. 1, the frame cassette 100 includes, among other components, a housing 150, four cover cases 110*a*, 110*b*, 110*c*, and 110*d* (collectively, "110"), and cover case bases 102. The housing 150 defines an inner space 152 of the frame cassette 100. While the housing 150 shown in FIG. 1 has a specific shape, it should be understood that the housing 150 can have various shapes in various embodiments.

In the example shown in FIG. 1, a frame vent hole 172*a* is located at the bottom surface of the housing 150, while a frame vent hole 172*b* is located at the top surface of the housing 150. The frame vent hole 172*a* is an inlet of an airflow, and the frame vent hole 172*b* is an outlet of the airflow, or vice versa. The airflow flowing through the housing 150 through the frame vent holes allows for reducing contamination sources such as particles, volatile organic compounds, and the like, inside the inner space 152. While only two frame vent holes 172*a* and 172*b* are utilized in the example shown in FIG. 1, it should be understood that more frame vent holes (e.g., four frame vent holes, two as inlets and two as outlets) and different configurations (e.g., located at side walls) can be used in other embodiments.

In the example shown in FIG. 1, the cover cases 110*a*, 110*b*, 110*c*, and 110*d* are placed in the housing 150, one over another in a vertical direction (i.e., the Z-direction shown in FIG. 1). In other words, the cover cases 110*a*, 110*b*, 110*c*, and 110*d* are vertically aligned. Each of the cover cases 110*a*, 110*b*, 110*c*, and 110*d* is placed on cover case bases 102 mounted on, for example, sidewalls of the housing 150. While four cover cases 110*a*, 110*b*, 110*c*, and 110*d* are shown in FIG. 1 as an example, it should be understood that more or fewer cover cases 110 can be placed in the housing 150 in other embodiments.

Each of the four cover cases 110*a*, 110*b*, 110*c*, and 110*d* is capable of accommodating or configured to accommodate a frame. In the example shown in FIG. 1, the cover case 110*a* is capable of accommodating a frame 112*a* in an enclosed space 192*a*; the cover case 110*b* is capable of accommodating a frame 112*b* in an enclosed space 192*b*; the cover case 110*c* is capable of accommodating a frame 112*c* in an enclosed space 192*c*; the cover case 110*d* is capable of accommodating a frame 112*d* in an enclosed space 192*d*. Details of the cover cases 110 will be discussed below with reference to FIGS. 2 and 3. The enclosed spaces 192*a*, 192*b*, 192*c*, and 192*d* are operable to accommodate the frames 112*a*, 112*b*, 112*c*, and 112*d*, respectively.

The frames 112*a*, 112*b*, 112*c*, and 112*d* (collectively, "112") are placed in the cover cases 110*a*, 110*b*, 110*c*, and 110*d*, respectively, after being cleaned. The cover cases 110*a*, 110*b*, 110*c*, and 110*d* prevent the frames 112*a*, 112*b*, 112*c*, and 112*d*, respectively, from being contaminated by the particles originated from other frames, the particles originated from the frame cassette 100, the particle originated from the airflow, and volatile organic compounds.

Figure 2:
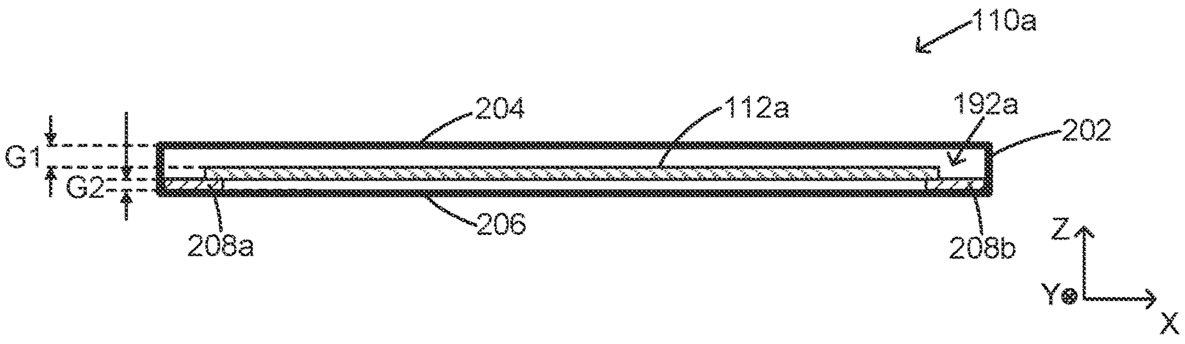
FIG. 2 is a diagram illustrating a side view of an example cover case in accordance with some embodiments.
Figure 3:
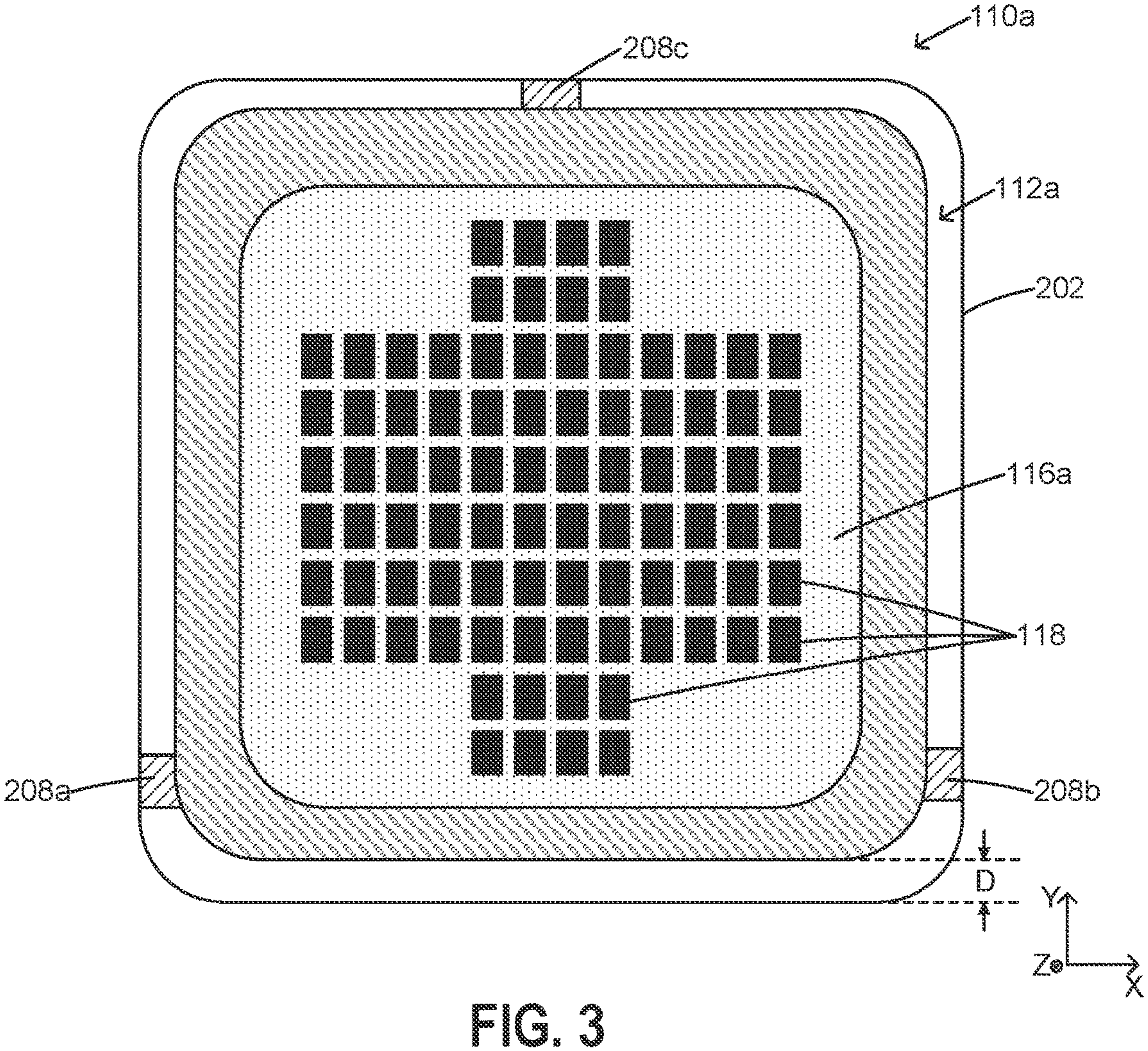
FIG. 3 is a diagram illustrating a top view of the example cover case in accordance with some embodiments.

FIG. 2 is a diagram illustrating a side view of an example cover case 110*a* in accordance with some embodiments. FIG. 3 is a diagram illustrating a top view of the example cover case 110*a* in accordance with some embodiments. In the example shown in FIGS. 2 and 3, the cover case 110*a* includes, among other components, a bottom section 206, multiple sidewalls 202, and a top section 204. The bottom section 206 and the top section 204 are parallel to each other and extend in a horizontal plane (i.e., the X-Y plane shown in FIG. 2). The sidewalls 202 extend in the Z-direction between the bottom section 206 and the top section 204. The sidewalls 202 connect the bottom section 206 and the top section 204 to form an enclosed space 192*a*.

In the example shown in FIGS. 2 and 3, the cover case 110*a* further includes three frame bases 208*a*, 208*b*, and 208*c* (collectively, "208"). The frame bases 208*a*, 208*b*, and 208*c* are disposed on the bottom section 206. In one embodiment, the frame bases 208*a*, 208*b*, and 208*c* are fixed to the bottom section 206. In another embodiment, each of the frame bases 208*a*, 208*b*, and 208*c* is fixed to one of the sidewalls 202. In yet another embodiment, each of the frame bases 208*a*, 208*b*, and 208*c* is fixed to both the bottom section 206 and one of the sidewalls 202.

The frame bases 208*a*, 208*b*, and 208*c* are configured to support the frame 112*a* when the frame 112*a* is placed in the cover case 110*a*. In the example shown in FIGS. 2 and 3, the frame bases 208*a*, 208*b*, and 208*c* are arranged at three vertices of a triangle, thereby providing steady support for the frame 112*a* when the frame 112*a* is placed in the cover case 110*a*. It should be understood that more than three (e.g., four, six, eight, etc.) frame bases 208 can be employed in other embodiments.

Due to the presence of the frame bases 208*a*, 208*b*, and 208*c*, the frame 112*a* is not in direct contact with the bottom section 206, thereby reducing, for example, contamination or scratches at the backside of the frame 112*a*. As shown in FIG. 2, the distance (i.e., the height of the frame bases 208 in the Z-direction), in the Z-direction, between the bottom of the frame 112*a* and the bottom section 206 is G2, whereas the distance, in the Z-direction, between the top of the frame 112*a* and the top section 204 is G1. The presence of G1 can avoid contact or wear of the frame 112*a* during the transportation of the frame cassette 100 and the cover case 110*a*. In some embodiments, G1 is larger than 0.1 mm. While G2 is larger than zero in the example shown in FIGS. 2 and 3, it should be understood that G2 could be zero in one embodiment.

As shown in FIG. 3, the frame 112*a* is placed on the frame bases 208*a*, 208*b*, and 208*c*. An adhesive tape 116*a* is disposed on or attached to the top surface of the frame 112*a*. Multiple top dies 118 are adhered to the adhesive tape 116*a* before they are picked by a pick-and-place tool later. In one implementation, the adhesive tape 116*a* is an ultraviolet (UV) tape. The adhesive strength of the UV tape remains relatively high before UV irradiation but decreases during and after UV irradiation. Thus, after UV irradiation, the top dies once adhered to the UV tape can be picked by a pick-and-place and subsequently bonded to, for example, corresponding bottom dies disposed on a wafer.

As shown in FIG. 3, the distance between the peripheral of the frame 112*a* and the inner surface of the cover case 110*a* is D. In one embodiment, D is larger than zero. In other words, there is a gap between the peripheral of the frame 112*a* and the inner surface of the cover case 110*a*. In another embodiment, D is zero. In other words, there is no gap between the peripheral of the frame 112*a* and the inner surface of the cover case 110*a*, which might be beneficial to avoiding contact or wear of the frame 112*a* during the transportation of the frame cassette 100 and the cover case 110*a*.

It should be understood that the example shown in FIGS. 2 and 3 are not intended to be limiting, and other shapes and geometries of the cover case 110*a* and the frame bases 208 can be employed in other embodiments as needed.

In some embodiments, the cover case 110 is made of (i.e., the bottom section 206, the top section 204, and the sidewalls 202 are made of) an electrostatic discharge (ESD) material, which reduces static electricity to prevent particles from being attracted to the cover case 110. In one example, the cover case 110 is made of a metal. In another example, the cover case 110 is made of a plastic material such as polycarbonate (PC), polyetherimide (PEI), Entegris Barrier material (EBM), and the like. In yet another example, the cover case 110 is made of rubber. In another example, the cover case 110 is made of two or more of the materials mentioned above. It should be understood that these examples are not intended to be limiting, and other suitable materials may be employed in other embodiments as needed.

Figure 4:
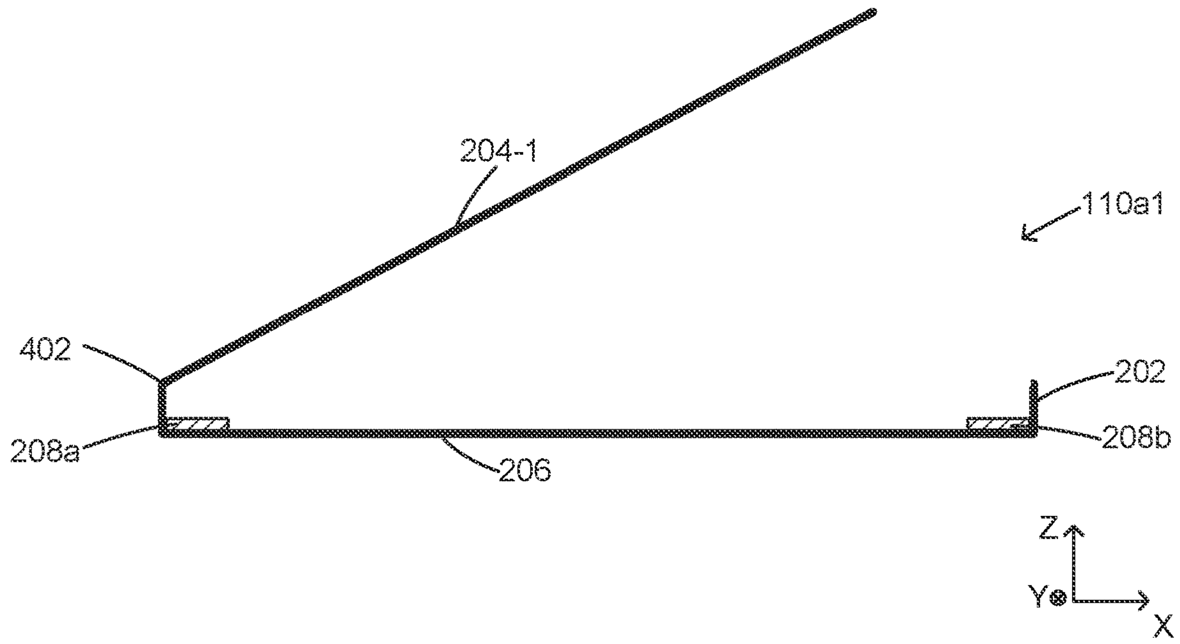
FIG. 4 is a diagram illustrating an example cover case in accordance with some embodiments.

FIG. 4 is a diagram illustrating an example cover case **110*a*1 in accordance with some embodiments. The cover case 110*a*1 is similar to the cover case 110*a* shown in FIGS. 2 and 3, and identical or similar features of the cover case 110*a*1 are, therefore, not repeated. In the example shown in FIG. 4, the cover case 110*a*1 includes, among other components, a movable upper section 204-1. One end of the movable upper section 204-1 is fixed to the top portion of one of the multiple sidewalls 202 by, for example, a hinge 402. The movable upper section 204-1 can rotate with respect to the sidewalls 202 and the bottom section 206. In this example shown in FIG. 4, each of the frame bases 208*a* and 208*b* can be fixed to the bottom section 206, one of the sidewalls 202**, or both.

Figure 5:
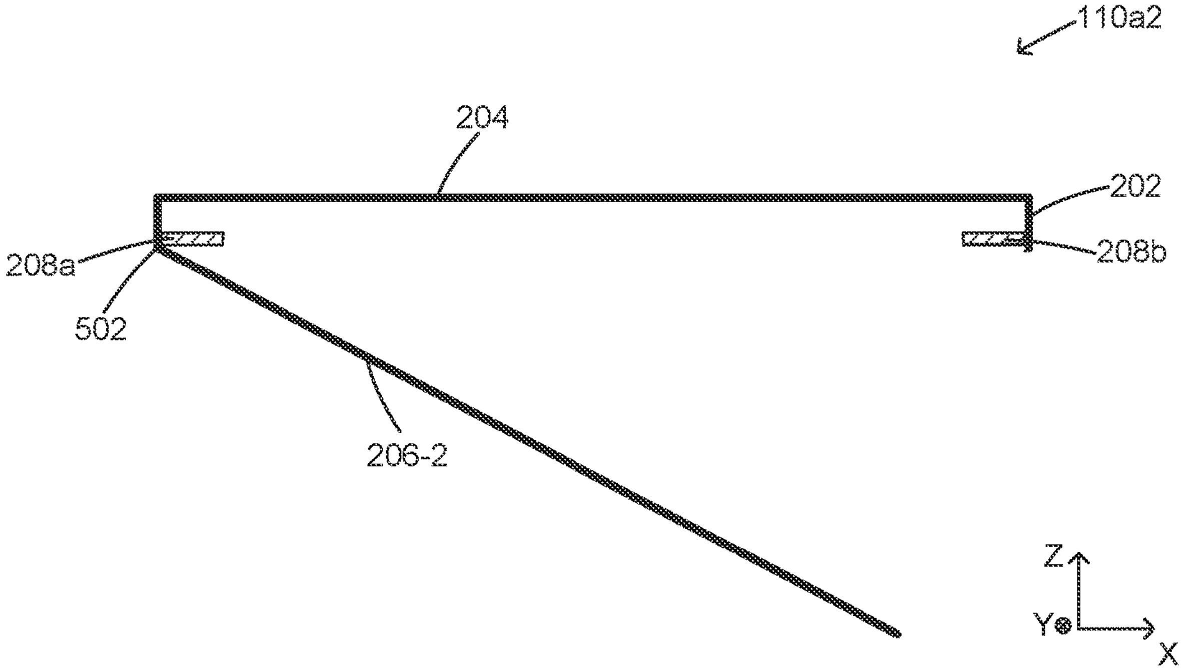
FIG. 5 is a diagram illustrating an example cover case in accordance with some embodiments.

FIG. 5 is a diagram illustrating an example cover case **110*a*2 in accordance with some embodiments. The cover case 110*a*2 is similar to the cover case 110*a* shown in FIGS. 2 and 3, and identical or similar features of the cover case 110*a*2 are, therefore, not repeated. In the example shown in FIG. 5, the cover case 110*a*2 includes, among other components, a movable bottom section 206-2. The movable bottom section 206-2 is fixed to the bottom portion of one of the multiple sidewalls 202 by, for example, a hinge 502. The movable bottom section 206-2 can rotate with respect to the sidewalls 202 and the top section 204. In this example shown in FIG. 5, each of the frame bases 208*a* and 208*b* are fixed to one of the sidewalls 202**.

Example Cover Cases with Vent Holes

As mentioned above, volatile organic compounds (VOCs), originated from frames or the frame cassette itself, exist in the inner space 152 inside the frame cassette 100, as shown in FIG. 1. One of the many sources of volatile organic compounds is the UV tape, which may outgas volatile organic compound during the UV irradiation and condense later. Volatile organic compounds may contaminate the top dies disposed on the frame 112. Therefore, it is advantageous to provide good ventilation inside the cover cases 110 shown in FIG. 1 so that the volatile organic compounds inside the cover cases 110 can be carried out.

Figure 6:
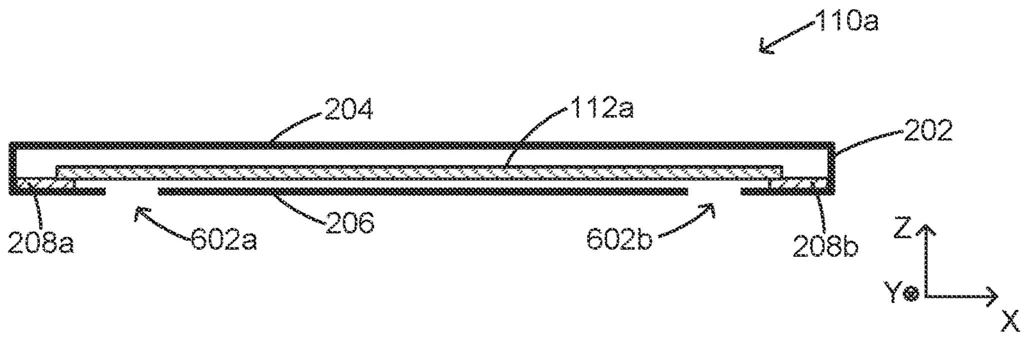
FIG. 6 is a diagram illustrating an example cover case with vent holes at its bottom section in accordance with some embodiments.
Figure 7:
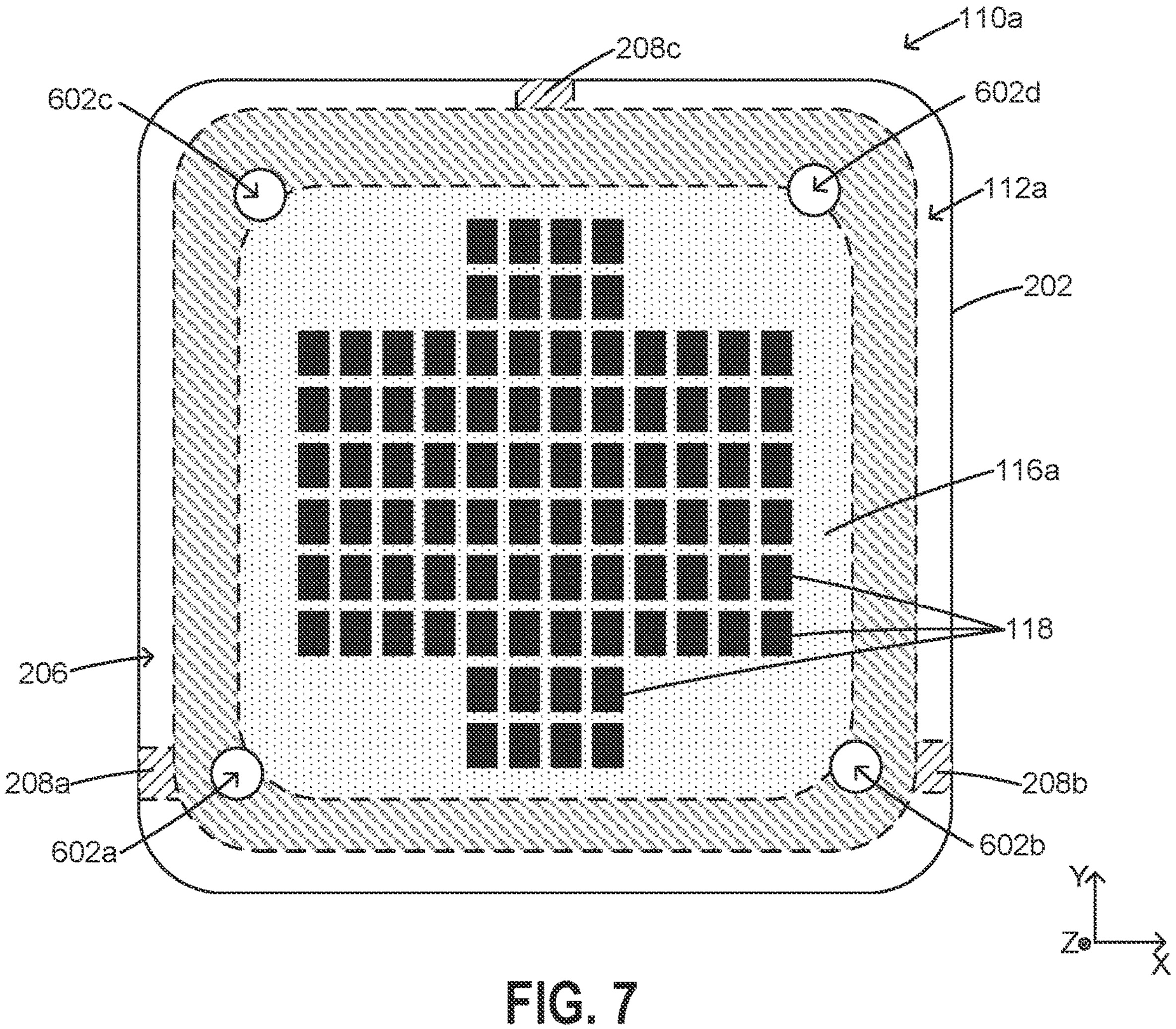
FIG. 7 is a diagram illustrating a bottom view of the cover case shown in FIG. 6 in accordance with some embodiments.

FIG. 6 is a diagram illustrating an example cover case **110*a* with vent holes at its bottom section in accordance with some embodiments. FIG. 7 is a diagram illustrating a bottom view of the cover case 110*a* shown in FIG. 6 in accordance with some embodiments. The cover case 110*a* shown in FIGS. 6 and 7 is similar to the cover case 110*a* shown in FIGS. 2 and 3, and identical or similar features of the cover case 110*a*** are, therefore, not repeated.

In the example shown in FIGS. 6 and 7, the cover case **110*a* includes, among other components, four vent holes 602*a*, 602*b*, 602*c*, and 602*d* (collectively, "602") located at the bottom section 206. At least one of the four vent holes 602 is used as an inlet of the airflow, and at least one of the four vent holes 602 is used as an outlet of the airflow. In one example, the vent holes 602*a* and 602*c* are used as inlets of the airflow, and the vent holes 602*b* and 602*d* are used as outlets of the airflow. While four vent holes 602 are used in the example shown in FIGS. 6 and 7, it should be understood that fewer (e.g., two or three) or more (e.g., six, eight, etc.) vent holes 602 can be disposed at the bottom section 206** in other embodiments.

In the example shown in FIGS. 6 and 7, the vent holes **602*a*, 602*b*, 602*c*, and 602*d* are aligned, in the Z-direction, with the peripheral region of the frame 112*a* to mitigate the risk of introducing particles to the back of the adhesive tape 116*a*. Particles attached to the back of the adhesive tape may result in failure in picking a top die by a suction head of the pick-and-place tool. In one example, the vent holes 602*a*, 602*b*, 602*c*, and 602*d* do not overlap, in the Z-direction, with the adhesive tape 116*a*. In another example, the vent holes 602*a*, 602*b*, 602*c*, and 602*d* do not overlap, in the Z-direction, with any of the top dies 118. It should be understood that the example shown in FIGS. 6 and 7 are not intended to be limiting, and other geometries, sizes, locations, and patterns of the vent holes 602 can be employed in other embodiments. In one embodiment, each of the vent holes 602*a*, 602*b*, 602*c*, and 602*d*** has an area greater than 0.1 $mm^2$.

Figure 8:
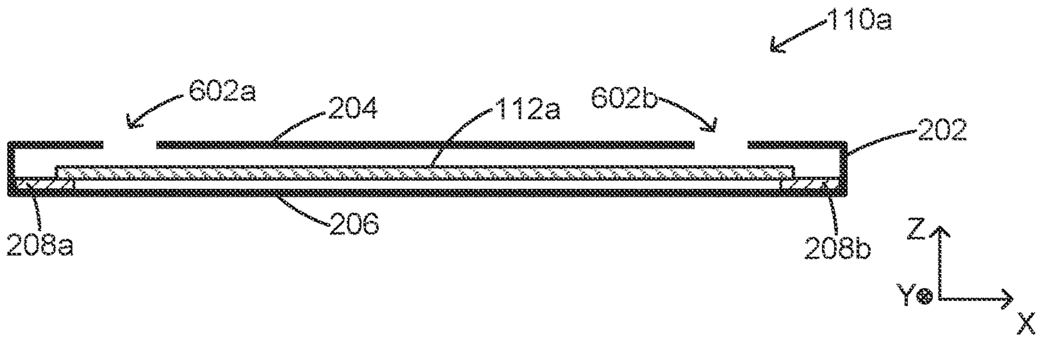
FIG. 8 is a diagram illustrating an example cover case with vent holes at its top section in accordance with some embodiments.
Figure 9:
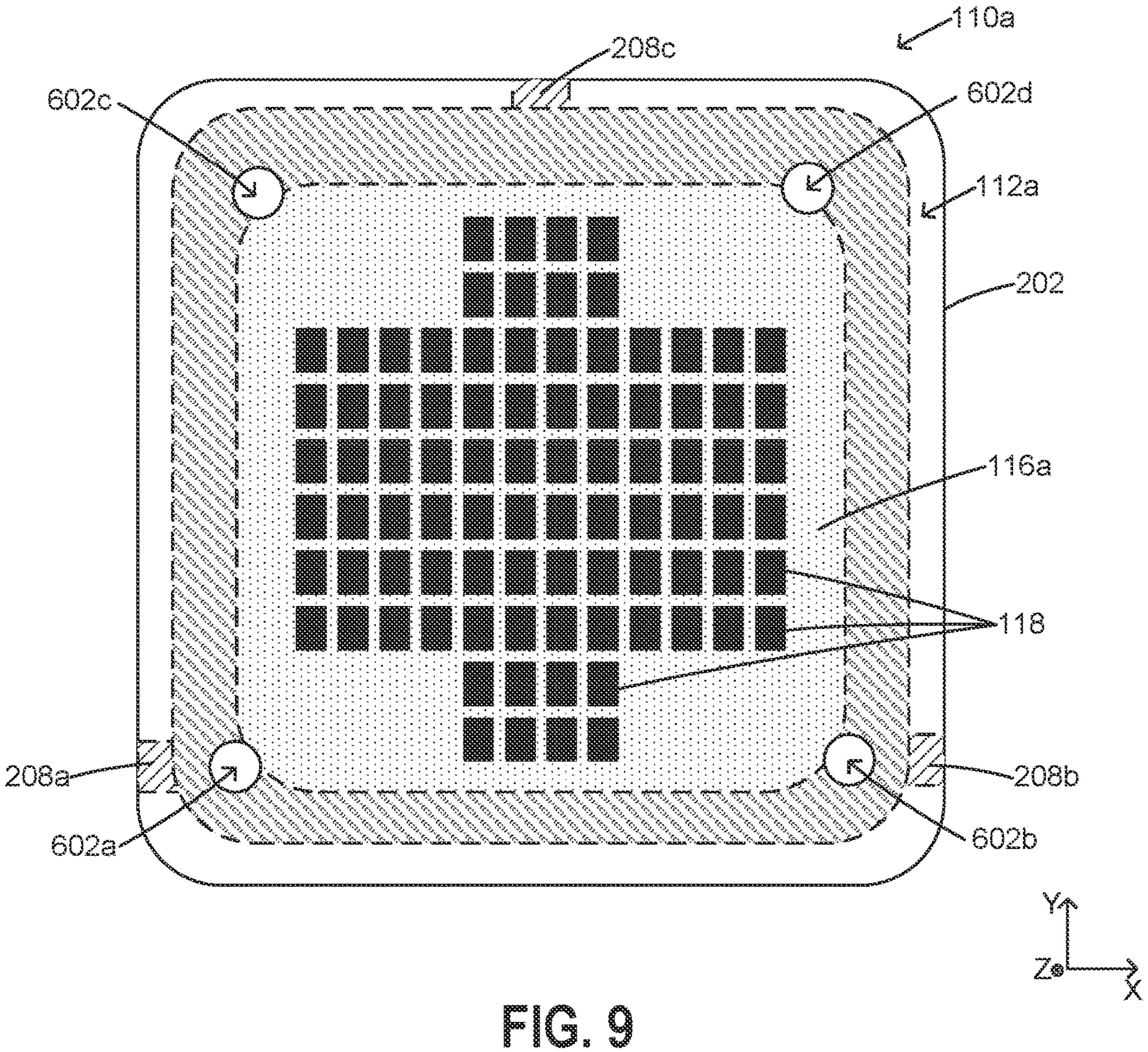
FIG. 9 is a diagram illustrating a top view of the cover case shown in FIG. 8 in accordance with some embodiments.

FIG. 8 is a diagram illustrating an example cover case **110*a* with vent holes at its top section in accordance with some embodiments. FIG. 9 is a diagram illustrating a top view of the cover case 110*a* shown in FIG. 8 in accordance with some embodiments. The cover case 110*a* shown in FIGS. 8 and 9 is similar to the cover case 110*a* shown in FIGS. 2 and 3, and identical or similar features of the cover case 110*a*** are, therefore, not repeated.

In the example shown in FIGS. 8 and 9, the cover case **110*a* includes, among other components, four vent holes 602*a*, 602*b*, 602*c*, and 602*d* (collectively, "602") located at the top section 204. At least one of the four vent holes 602 is used as an inlet of the airflow, and at least one of the four vent holes 602 is used as an outlet of the airflow. In one example, the vent holes 602*a* and 602*c* are used as inlets of the airflow, and the vent holes 602*b* and 602*d* are used as outlets of the airflow. While four vent holes 602 are used in the example shown in FIGS. 8 and 9, it should be understood that fewer (e.g., two or three) or more (e.g., six, eight, etc.) vent holes 602 can be disposed at the top section 204** in other embodiments.

In the example shown in FIGS. 8 and 9, the vent holes **602*a*, 602*b*, 602*c*, and 602*d* are aligned, in the Z-direction, with the peripheral region of the frame 112*a* to mitigate the risk of introducing particles to the top surfaces of the top dies 118. In one example, the vent holes 602*a*, 602*b*, 602*c*, and 602*d* do not overlap, in the Z-direction, with the adhesive tape 116*a*. In another example, the vent holes 602*a*, 602*b*, 602*c*, and 602*d* do not overlap, in the Z-direction, with any of the top dies 118. It should be understood that the example shown in FIGS. 8 and 9 are not intended to be limiting, and other geometries, sizes, locations, and patterns of the vent holes 602 can be employed in other embodiments. In one embodiment, each of the vent holes 602*a*, 602*b*, 602*c*, and 602*d*** has an area greater than 0.1 $mm^2$.

Figure 10:
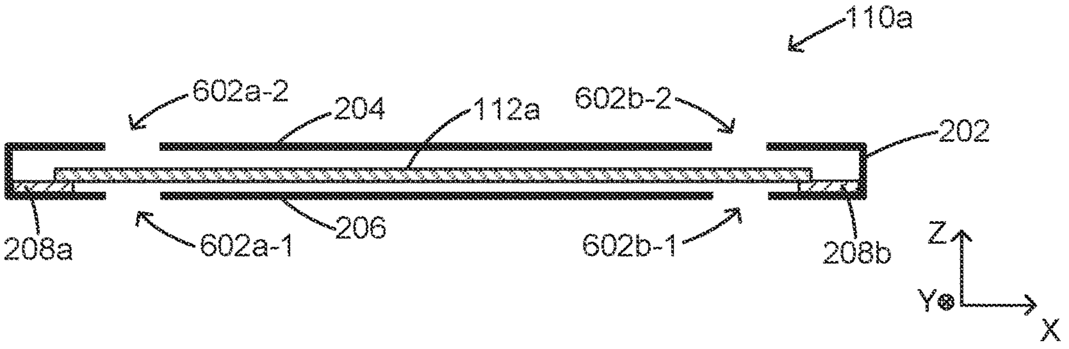
FIG. 10 is a diagram illustrating an example cover case with vent holes at both its top section and bottom section in accordance with some embodiments.

FIG. 10 is a diagram illustrating an example cover case **110*a* with vent holes at both its top section and bottom section in accordance with some embodiments. The cover case 110*a* shown in FIG. 10 is similar to the cover case 110*a* shown in FIGS. 2 and 3, and identical or similar features of the cover case 110*a*** are, therefore, not repeated.

In the example shown in FIG. 10, the cover case **110*a* includes, among other components, two vent holes 602*a*-1 and 602*b*-1 (collectively, "602-1") located at the bottom section 206 and two vent holes 602*a*-2 and 602*b*-2 (collectively, "602-2") located at the top section 204. In one example, one of the two vent holes 602-1 is used as an inlet of the airflow, and the other of the two vent holes 602-1 is used as an outlet of the airflow; one of the two vent holes 602-2 is used as an inlet of the airflow, and the other of the two vent holes 602-2 is used as an outlet of the airflow. While two vent holes 602-1 at the bottom section 206 and two vent holes 602-2 at the top section 204 are used in the example shown in FIG. 10, it should be understood that fewer (e.g., one) or more (e.g., three, four, etc.) vent holes 602-1 at the bottom section 206 and fewer (e.g., one) or more (e.g., three, four, etc.) vent holes 602-2 at the top section 204** can be employed in other embodiments.

Figure 11:
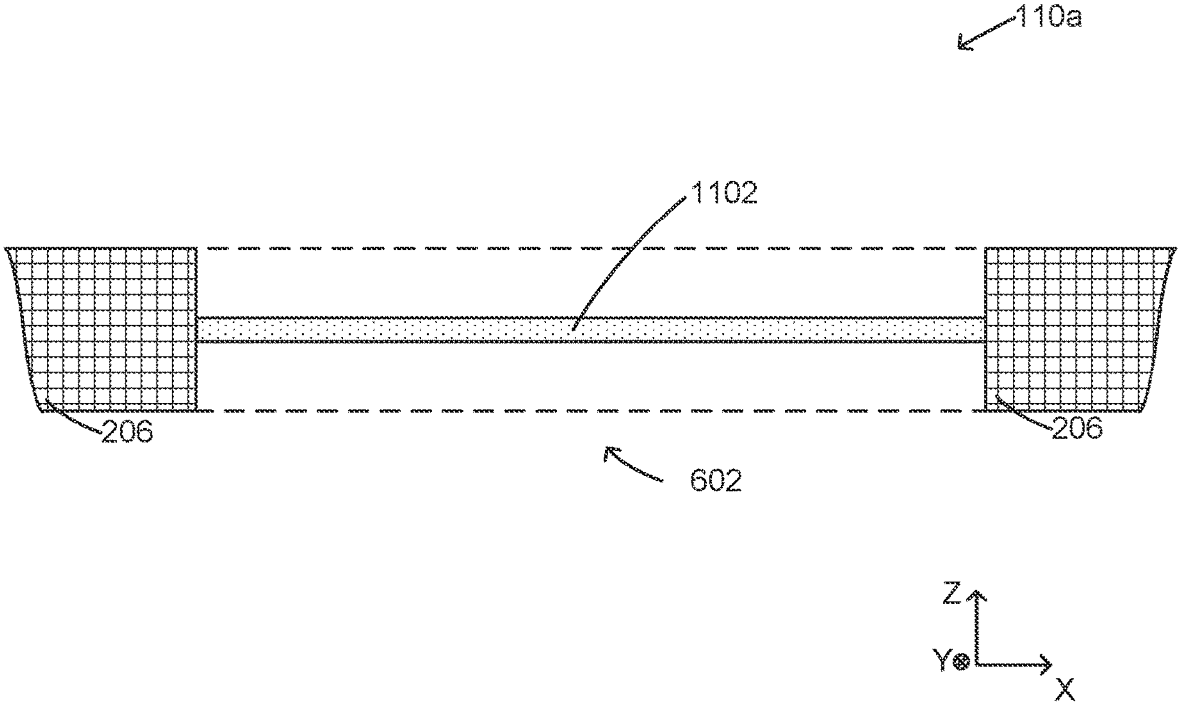
FIG. 11 is a diagram illustrating a vent hole in accordance with some embodiments.

FIG. 11 is a diagram illustrating a vent hole 602 in accordance with some embodiments. In the example shown in FIG. 11, the vent hole 602 is disposed at the bottom section 206. In the example shown in FIG. 11, the vent hole 602 further includes a filter 1102 disposed in the vent hole 602. The filter 1102 can remove solid particulates such as the particles mentioned above and gaseous pollutants such as the volatile organic compounds discussed above.

In some embodiments, the filter 1102 is a pleated filter which has folds or pleats, thereby increasing the surface area for better filtering. In other embodiments, the filter 1102 is a non-pleated or flat filter which provides maximum airflow and is suitable for relatively high airflow pressure. The filter 1102 can be made of paper, foam, carbon, aluminum, steel, fiberglass, plastic, or any other suitable materials.

In one embodiment, the cover case 110*a* includes two vent holes 602 (one as the inlet and the other as the outlet), and at least the vent hole 602 that serves as the inlet includes the filter 1102. It should be understood that this embodiment is not intended to be limiting.

Example Cover Cases with Humidity Control

Figure 12:
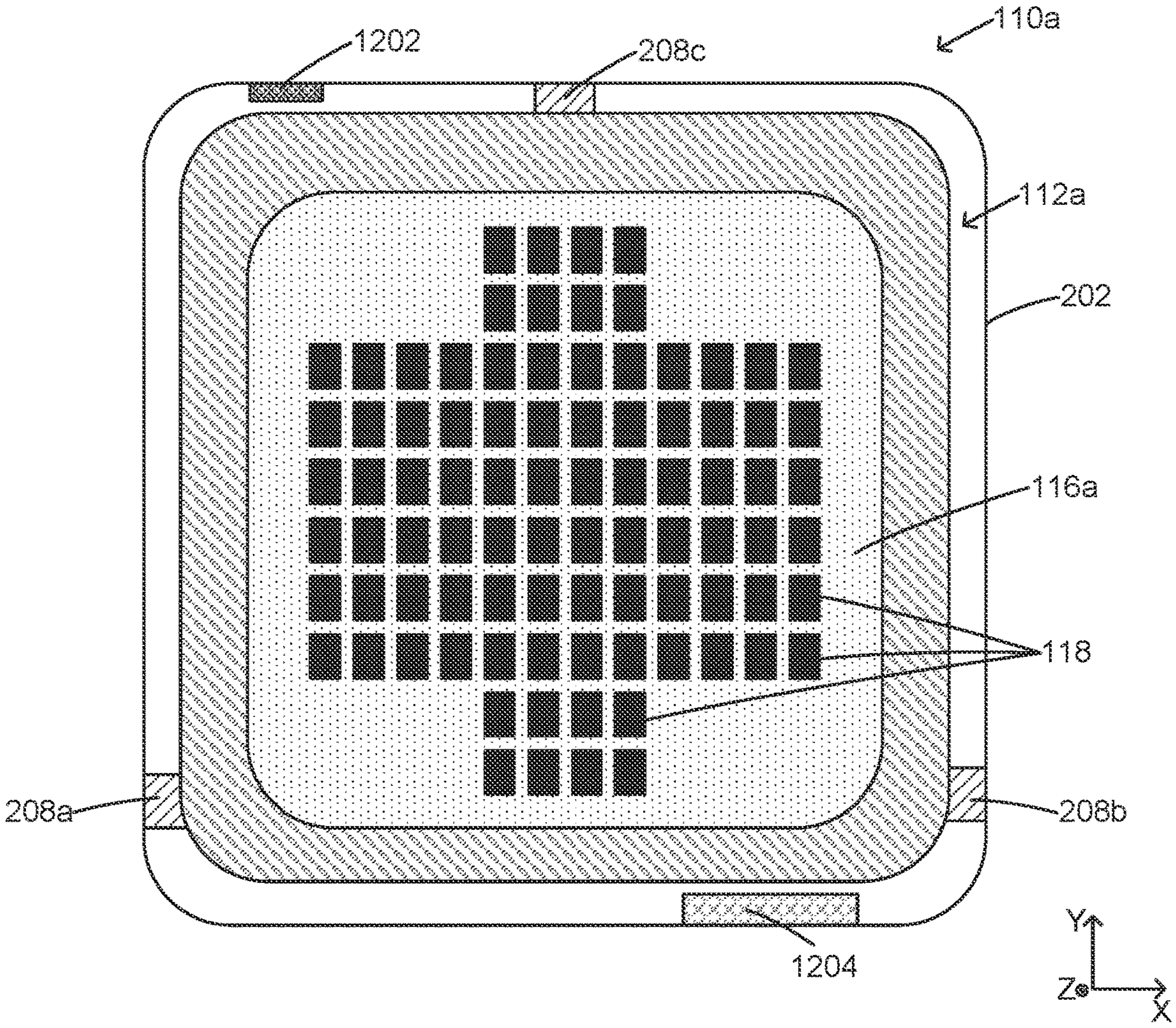
FIG. 12 is a diagram illustrating an example cover case with humidity control in accordance with some embodiments.
Figure 13:
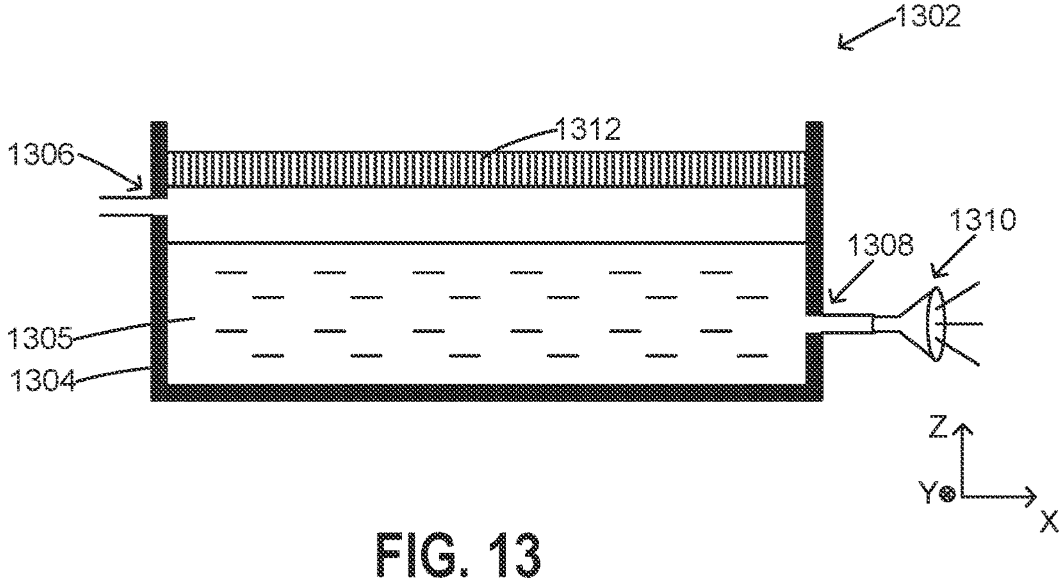
FIG. 13 is a diagram illustrating an example humidifier in accordance with some embodiments.

FIG. 12 is a diagram illustrating an example cover case 110*a* with humidity control in accordance with some embodiments. FIG. 13 is a diagram illustrating an example humidifier 1302 in accordance with some embodiments.

The cover case 110*a* shown in FIG. 12 is similar to the cover case 110*a* shown in FIGS. 2 and 3, and identical or similar features of the cover case 110*a* are, therefore, not repeated. In the example shown in FIG. 12, the cover case 110*a* includes, among other components, a humidity sensor 1202 and a humidity adjustment unit 1204.

The humidity sensor 1202 is configured to measure the humidity of the air inside the cover case 110*a*. In one embodiment, the humidity is sent to a control system, which controls the humidity adjustment unit 1204 based on the measured humidity. In some implementations, the humidity can be read from outside the cover case 110*a* and the frame cassette 100 using, for example, wireless communication, optical detection, visual inspection, and the like.

In some embodiments, the humidity sensor 1202 is based on materials that can change chemically depending on the humidity, such as cobalt chloride film or test paper, the color of which changes accordingly as the humidity changes. In other embodiments, the humidity sensor 1202 is based on materials that can change physically (i.e., certain physical properties of the material change) depending on the humidity. In one example, the material is colored alcohol, and the volume of the colored alcohol changes accordingly as the humidity changes. In some other embodiments, the humidity sensor 1202 is based on materials that can change electrically (i.e., electrical signals associated with the material changes) depending on the humidity. In one example, the material is aluminum oxide film that can absorb water from the environment, and the capacitance or resistance of the aluminum oxide film changes accordingly as the humidity changes. While these embodiments and examples are discussed above, it should be understood that other types of humidity sensors (e.g., optical hygrometers) or other types of materials (e.g., polymers) can be employed in other embodiments.

The humidity adjustment unit 1204 is configured to adjust the humidity of the air inside the cover case 110*a*. In one embodiment, the humidity adjustment unit 1204 includes a humidifier to increase the humidity of the air inside the cover case 110*a*. In another embodiment, the humidity adjustment unit 1204 includes a dehumidifier to decrease the humidity of the air inside the cover case 110*a*. In yet another embodiment, the humidity adjustment unit 1204 includes both a humidifier to increase the humidity of the air inside the cover case 110*a* and a dehumidifier to decrease the humidity of the air inside the cover case 110*a*.

In the example shown in FIG. 13, the humidifier 1302 includes, among other components, a water tank 1304, an inlet 1306, an outlet 1308, a nozzle 1310, a spill-prevention member 1312. The water tank 1304 is, for example, a chamber that accommodates water 1305. The inlet 1306 is in liquid communication with a water source through, for example, a conduit. In some implementations, when the water level in the water tank 1304 is below a certain minimum level, water 1305 can be added to the water tank 1304 automatically through the inlet 1306 until the water level reaches a certain maximum level (which is below the height of the inlet 1306).

The outlet 1308, which is below the minimum level, is in liquid communication with the nozzle 1310 through, for example, a conduit. When the controller sends a control signal to the humidifier 1302, water 1305 can be sprayed by the nozzle 1310 to increase the humidity of the air inside the cover case 110*a*. In one implementation, a switch (e.g., a solenoid) and a pump are controlled by the control signal to spray the water 1305 out of the nozzle 1310. In one embodiment, the opening area of the outlet 1308 is larger than 0.1 $mm^2$.

The spill-prevention member 1312 is disposed on the top of the water tank 1304. The spill-prevention member 1312 can prevent the water 1305 from spilling, especially during the transportation of the cover case 110*a* and the frame cassette 100. In one implementation, the spill-prevention member 1312 is a sponge fixed to the water tank 1304.

It should be understood that more than one outlet 1308 and more than one nozzle 1310 can be employed in other embodiments. It should be understood that the humidifier 1302 may include additional components, such as heaters, piezoelectric vibrators, and the like, to allow for better delivery of the water 1305 in the water tank 1304.

In one embodiment, the relative humidity (RH) is between 0 and 100%. In another embodiment, the relative humidity is between 20% and 60%. In yet another embodiment, the relative humidity is about 40%.

Figure 14:
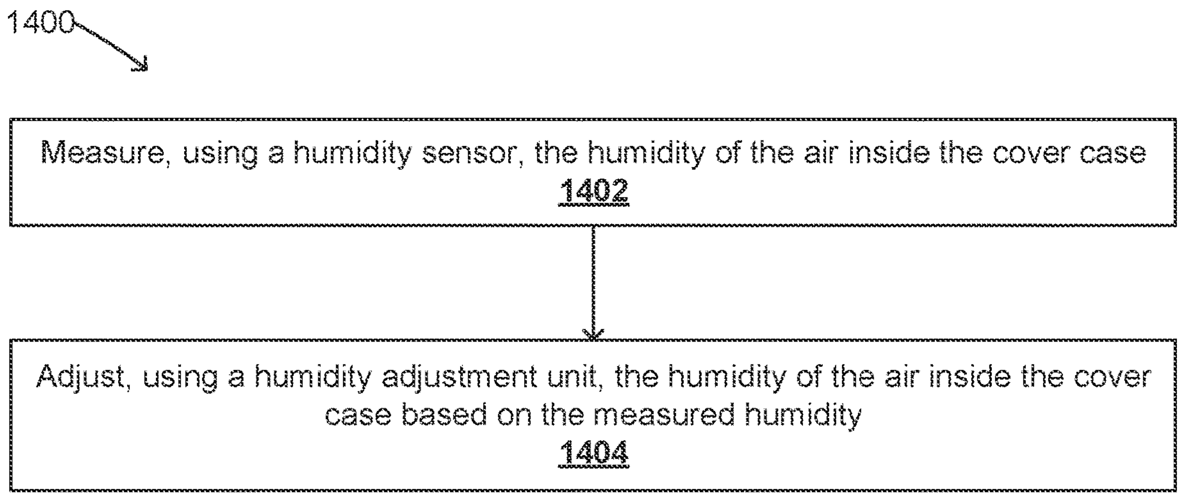
FIG. 14 is a flowchart diagram illustrating an example method in accordance with some embodiments.

FIG. 14 is a flowchart diagram illustrating an example method 1400 in accordance with some embodiments. In the example shown in FIG. 14, the method 1400 includes operations 1402 and 1404. Additional operations may be performed.

At operation 1402, the humidity of the air inside the cover case 110*a* is measured. In one implementation, the humidity is measured by a humidity sensor (e.g., the humidity sensor 1202 shown in FIG. 12). In one embodiment, the measured humidity is sent to a control system, which generates a control signal based on the measured humidity and, for example, a predetermined target humidity.

At operation 1404, the humidity of the air inside the cover case 110*a* is adjusted based on the measured humidity. In one implementation, the humidity is adjusted by a humidity adjustment unit (e.g., the humidity adjustment unit 1204 shown in FIG. 12). In one embodiment, the humidity adjustment unit includes a humidifier (e.g., the humidifier 1302 shown in FIG. 13) and a dehumidifier. In one embodiment, the humidity is adjusted by the humidity adjustment unit after it receives the control signal generated by the control system and, therefore, based on the measured humidity.

Example Method for Semiconductor Device Packaging

For die-to-wafer bonding and die-to-die bonding, which involve stacking a die on a wafer, a die on an interposer, or a die on a die, the infrastructure to handle dies without particle adders, as well as the ability to bond dies, becomes a major challenge. Typically, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility.

Pick-and-place tools (sometimes also referred to as "pick-and-place systems") are part of the infrastructure to handle dies in the context of die-to-wafer bonding and die-to-die bonding. A pick-and-place system is an automatic system that can pick a die (often referred to as a "top die") and place it onto another die (often referred to as a "bottom die") or a host wafer, often in a high-speed manner. A person may take the complexity and difficulty of such tasks of picking and placing a top die for granted. On the contrary, accurate alignment of dies, without comprising the high system throughput, is very challenging, especially considering that the alignment accuracies are on the order of microns (i.e., micrometers). If the position shift error cannot be further reduced, the critical size of hybrid bonding metal pads cannot be reduced, which in turn limits bonding density.

Figure 15:
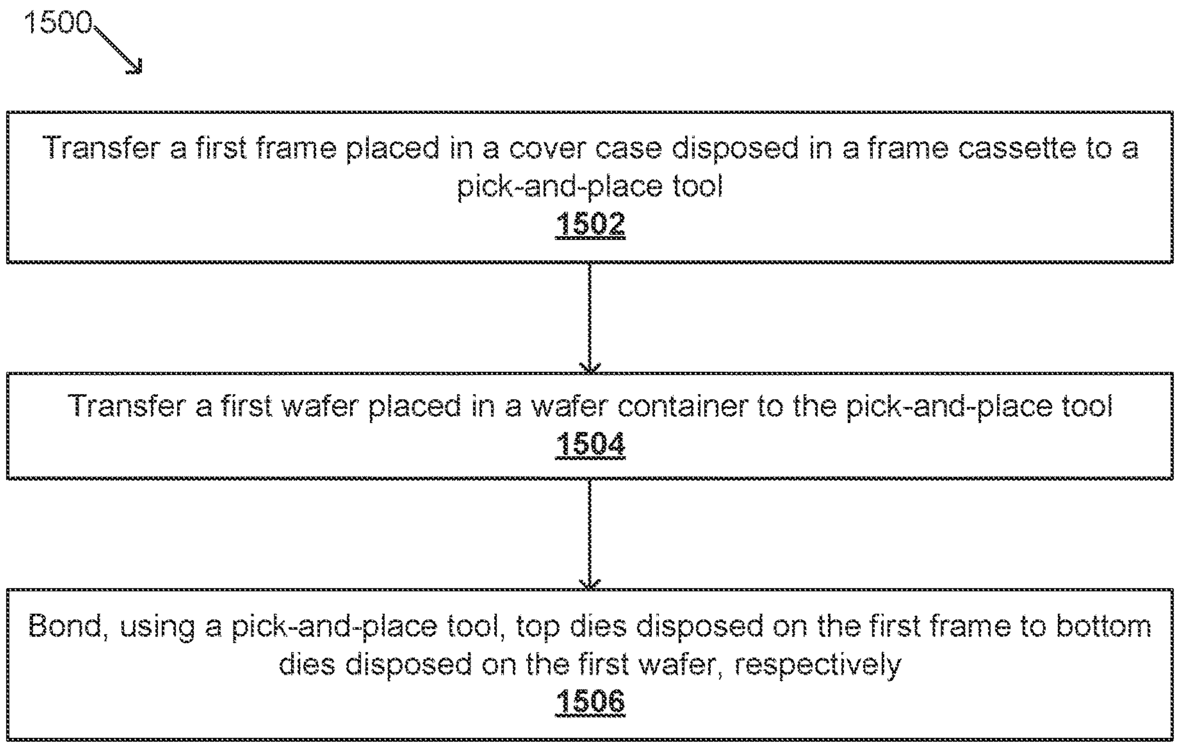
FIG. 15 is a flowchart diagram illustrating an example method for semiconductor device packaging in accordance with some embodiments.

FIG. 15 is a flowchart diagram illustrating an example method 1500 for semiconductor device packaging in accordance with some embodiments. In the example shown in FIG. 15, the method 1500 includes operations 1502, 1504, and 1506. Additional operations may be performed. Also, it should be understood that the sequence of the various operations discussed above with reference to FIG. 15 is provided for illustrative purposes, and as such, other embodiments may utilize different sequences. In one example, operation 1504 can be performed before operation 1502. These various sequences of operations are to be included within the scope of embodiments.

At operation 1502, a first frame (e.g., the frame 112*a* shown in FIG. 1) placed in a cover case (e.g., the cover case 110*a* shown in FIG. 1) disposed in a frame cassette (e.g., the frame cassette 100 shown in FIG. 1) is transferred to a pick-and-place tool. Multiple top dies are disposed on the first frame. In one embodiment, the pick-and-place tool is located in a pick-and-place chamber. In one implementation, the first frame is handled by, for example, a transfer robot.

At operation 1504, a first wafer placed in a wafer container is transferred to the pick-and-place tool. Multiple bottom dies are disposed on the first wafer and correspond to the multiple top dies, respectively. In one implementation, the first wafer is handled by, for example, a transfer robot.

At operation 1506, top dies on the first frame are bonded to the corresponding bottom dies on the first wafer. In one embodiment, the top dies are bonded to the corresponding bottom dies using the pick-and-place tool.

It should be understood that the example method 1500 may include other operations. In one example, the first frame is wetted, using water, prior to transferring the first frame to the pick-and-place tool, and the first wafer is wetted, using water, prior to transferring the first wafer to the pick-and-place tool. In another example, the humidity inside the cover case is adjusted (e.g., using the method 1400 shown in FIG. 14).

SUMMARY

In accordance with some aspects of the disclosure, a frame cassette used for semiconductor processing is provided. The frame cassette includes: a housing; and a plurality of cover cases disposed in the housing. Each of the plurality of cover cases is capable of accommodating a frame and includes: a bottom section; a top section parallel to the bottom section; and at least one sidewall extending, in a vertical direction, between and connecting the bottom section and the top section to form an enclosed space.

In accordance with some aspects of the disclosure, a cover case used for semiconductor processing is used. The cover case includes: a bottom section; a top section parallel to the bottom section; and at least one sidewall extending, in a vertical direction, between and connecting the bottom section and the top section to form an enclosed space. The enclosed space is operable to accommodate a frame, and a plurality of top dies are disposed on the frame.

In accordance with some aspects of the disclosure, a method of semiconductor processing is provided. The method includes the following steps: transferring a first frame placed in a cover case disposed in a frame cassette to a pick-and-place tool, a plurality of top dies being disposed on the first frame, wherein the cover case is characterized by an enclosed space operable to accommodate the first frame; transferring a first wafer placed in a wafer container to the pick-and-place tool, a plurality of bottom dies being disposed on the first wafer and corresponding to the plurality of top dies, respectively; and bonding, by the pick-and-place tool, the plurality of top dies to the plurality of bottom dies, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A frame cassette used for semiconductor processing comprising:

a housing;

a plurality of cover cases disposed in the housing, wherein each of the plurality of cover cases is capable of accommodating a frame that holds at least one die on an adhesive tape, each of the plurality of cover cases comprising:

a bottom section;

a top section parallel to the bottom section; and at least one sidewall extending, in a vertical direction, between and connecting the bottom section and the top section to form an enclosed space;

a first frame vent hole serving as an inlet; and a second frame vent hole serving as an outlet.

2. The frame cassette of claim 1, wherein each of the plurality of cover cases further comprises a plurality of frame bases disposed on the bottom section.

3. The frame cassette of claim 2, wherein the plurality of frame bases are three frame bases.

4. The frame cassette of claim 2, wherein the plurality of frame bases are more than three frame bases.

5. The frame cassette of claim 2, wherein each of the plurality of cover cases further comprises a plurality of vent holes disposed at the bottom section.

6. The frame cassette of claim 5, wherein at least one of the plurality of vent holes serves as an inlet of an airflow, and at least one of the plurality of vent holes serves as an outlet of the airflow.

7. The frame cassette of claim 5, wherein at least one of the plurality of vent holes comprises a filter.

8. The frame cassette of claim 2, wherein each of the plurality of cover cases further comprises a plurality of vent holes disposed at the top section.

9. The frame cassette of claim 8, wherein at least one of the plurality of vent holes serves as an inlet of an airflow, and at least one of the plurality of vent holes serves as an outlet of the airflow.

10. The frame cassette of claim 1, wherein each of the plurality of cover cases further comprises:

a humidity sensor configured to measure a humidity inside each of the plurality of cover cases; and a humidity adjustment unit configured to adjust the humidity.

11. The frame cassette of claim 1, wherein the first frame vent hole is located at a bottom surface of the housing, and the second frame vent hole is located at a top surface of the housing.

12. A cover case used for semiconductor processing, the cover case comprising:

a bottom section;

a top section parallel to the bottom section;

at least one sidewall extending, in a vertical direction, between and connecting the bottom section and the top section to form an enclosed space, wherein the enclosed space is operable to accommodate a frame, a plurality of top dies being disposed on an adhesive tape on the frame;

a plurality of frame bases disposed on the bottom section; and a plurality of vent holes disposed at the top section.

13. The cover case of claim 12, wherein at least one of the plurality of vent holes serves as an inlet of an airflow, and at least one of the plurality of vent holes serves as an outlet of the airflow.

14. The cover case of claim 12, wherein a distance between the top section and a top surface of the frame is larger than 0.1 mm.

15. The cover case of claim 12, wherein the bottom section, the top section, and the at least one sidewall are made of a metal.

16. The cover case of claim 12, wherein the bottom section, the top section, and the at least one sidewall are made of a plastic.

17. The cover case of claim 12, wherein the cover case is placed in a frame cassette.

18. A method of semiconductor processing comprising:

transferring a first frame placed in a cover case disposed in a frame cassette to a pick-and-place tool, a plurality of top dies being disposed on the first frame, wherein the cover case is characterized by an enclosed space operable to accommodate the first frame;

transferring a first wafer placed in a wafer container to the pick-and-place tool, a plurality of bottom dies being disposed on the first wafer and corresponding to the plurality of top dies, respectively; and bonding, by the pick-and-place tool, the plurality of top dies to the plurality of bottom dies, respectively.

19. The method of claim 18, further comprising:

wetting the first frame prior to transferring the first frame to the pick-and-place tool; and wetting the first wafer prior to transferring the first wafer to the pick-and-place tool.

20. The method of claim 18, further comprising:

adjusting a humidity inside the cover case.

* * * * *